United States Patent
Shimada et al.

(10) Patent No.: US 9,825,213 B2
(45) Date of Patent: Nov. 21, 2017

(54) PIEZOELECTRIC ELEMENT, LIQUID DISCHARGE HEAD, ULTRASONIC MOTOR, AND DUST REMOVING DEVICE

(75) Inventors: Mikio Shimada, Tokyo (JP); Toshiaki Aiba, Fujisawa (JP); Toshihiro Ifuku, Yokohama (JP); Takanori Matsuda, Chofu (JP); Takayuki Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 631 days.

(21) Appl. No.: 13/977,915

(22) PCT Filed: Dec. 22, 2011

(86) PCT No.: PCT/JP2011/080550
§ 371 (c)(1),
(2), (4) Date: Dec. 16, 2013

(87) PCT Pub. No.: WO2012/093646
PCT Pub. Date: Jul. 12, 2012

(65) Prior Publication Data
US 2014/0084750 A1    Mar. 27, 2014

(30) Foreign Application Priority Data

Jan. 7, 2011 (JP) ................... 2011-001669
Dec. 15, 2011 (JP) ................... 2011-275097

(51) Int. Cl.
*H01L 41/187* (2006.01)
*H01L 41/09* (2006.01)
(Continued)

(52) U.S. Cl.
CPC .......... *H01L 41/1871* (2013.01); *B08B 7/028* (2013.01); *B41J 2/14233* (2013.01);
(Continued)

(58) Field of Classification Search
CPC .................... H01L 41/187; H01L 41/1871
(Continued)

(56) References Cited

U.S. PATENT DOCUMENTS 5,163,209 A * 11/1992 Harada ............... H01L 41/0477
                                                            29/25.35
6,531,805 B2 * 3/2003 Ikeda ................... G11B 5/4873
                                                            250/281
(Continued)

FOREIGN PATENT DOCUMENTS

| EP | 0932210 A2 | 7/1999 |
| EP | 1 039 559 A1 | 9/2000 |
| EP | 1 063 208 A1 | 12/2000 |
| JP | 2001-138529 A | 5/2001 |
| JP | 2002-255643 A | 9/2002 |
| JP | 2002-265299 A | 9/2002 |
| JP | 2008-150247 A | 7/2008 |

*Primary Examiner* — Derek Rosenau
(74) *Attorney, Agent, or Firm* — Canon U.S.A., Inc. IP Division

(57) ABSTRACT

A piezoelectric element having an improved piezoelectric constant is provided, and a liquid discharge head, an ultrasonic motor, and a dust removing device, each of which uses the above piezoelectric element, are also provided. A piezoelectric element at least includes a pair of electrodes and a piezoelectric material provided in contact with the pair of electrodes, the piezoelectric material is formed of an aggregate of crystal grains containing barium titanate as a primary component, and among the crystal grains of the aggregate, crystal grains at least in contact with the electrodes have dislocation layers in the grains. A liquid discharge head, an ultrasonic motor, and a dust removing device each use the above piezoelectric element.

10 Claims, 9 Drawing Sheets

(51) Int. Cl.
   *H01L 41/43*   (2013.01)
   *B08B 7/02*    (2006.01)
   *B41J 2/14*    (2006.01)
   *H02N 2/10*    (2006.01)
   *H02N 2/16*    (2006.01)

(52) U.S. Cl.
   CPC .......... *H01L 41/0973* (2013.01); *H01L 41/43* (2013.01); *H02N 2/106* (2013.01); *H02N 2/163* (2013.01)

(58) Field of Classification Search
   USPC .................................................. 310/358–360
   See application file for complete search history.

(56) References Cited

U.S. PATENT DOCUMENTS

| | | | |
|---|---|---|---|
| 6,984,922 B1* | 1/2006 | Nagahara | B06B 1/0622 310/321 |
| 7,309,950 B1* | 12/2007 | Aoki | B41J 2/14233 310/331 |
| 2002/0158224 A1 | 10/2002 | Aoto | |
| 2004/0051763 A1* | 3/2004 | Matsubara | B41J 2/14233 347/68 |
| 2005/0162047 A1* | 7/2005 | Torii | B41J 2/161 310/358 |
| 2007/0153385 A1* | 7/2007 | Sakai | G02B 27/0006 359/511 |

* cited by examiner

PIEZOELECTRIC ELEMENT, LIQUID DISCHARGE HEAD, ULTRASONIC MOTOR, AND DUST REMOVING DEVICE

TECHNICAL FIELD

The present invention relates to a piezoelectric element, a liquid discharge head, an ultrasonic motor, and a dust removing device. In particular, the present invention relates to a non-lead piezoelectric element which improves a piezoelectric constant by locally introducing dislocation layers.

BACKGROUND ART

As piezoelectric materials, lead-based ceramics, such as lead zirconate titanate (hereinafter referred to as "PZT"), having a perovskite structure are common.

However, PZT contains lead at an A site of the perovskite structure. Therefore, the influence of a lead component on environment has been considered as a problem. In order to overcome this problem, a piezoelectric material using a perovskite type oxide which contains no lead has been proposed.

As a typical non-lead perovskite type piezoelectric material, for example, barium titanate represented by general formula $BaTiO_3$ (hereinafter referred to as "BTO") may be mentioned.

For example, PTL 1 has disclosed a BTO ceramic having a high piezoelectric constant in which by performing two-stage sintering at different temperatures, the average grain diameter is controlled in a range of 1 to 2 μm and the maximum grain diameter is controlled to 5 μm. However, a strain amount of a piezoelectric element formed using a BTO ceramic was not yet sufficient.

CITATION LIST

Patent Literature

PTL 1 Japanese Patent Laid-Open No. 2008-150247

SUMMARY OF INVENTION

Technical Problem

The present invention was made in order to overcome the problems as described above and provides a piezoelectric element having an improved piezoelectric constant. In addition, the present invention also provides a liquid discharge head, an ultrasonic motor, and a dust removing device, each of which uses the above piezoelectric element.

Solution to Problem

A piezoelectric element which solves the above problems is a piezoelectric element at least having a pair of electrodes and a piezoelectric material provided in contact with the pair of electrodes. The piezoelectric material is formed of an aggregate of crystal grains containing barium titanate as a primary component, and among the crystal grains of the aggregate, crystal grains at least in contact with the electrodes have dislocation layers in the grains. A liquid discharge head to solve the above problems is a liquid discharge head which uses the above piezoelectric element. An ultrasonic motor to solve the above problems is an ultrasonic motor which uses the above piezoelectric element. A dust removing device to solve the above problems is a dust removing device which uses the above piezoelectric element.

Advantageous Effects of Invention

According to the present invention, a piezoelectric element having an improved piezoelectric constant can be provided. In addition, the present invention can also provide a liquid discharge head, an ultrasonic motor, and a dust removing device, each of which uses the above piezoelectric element.

DESCRIPTION OF EMBODIMENTS

Hereinafter, embodiments of the present invention will be described in detail.

A piezoelectric element of the present invention at least has a pair of electrodes and a piezoelectric material provided in contact with the pair of electrodes. In the present invention, the piezoelectric material is formed of an aggregate of crystal grains containing barium titanate as a primary component, and among the crystal grains of the aggregate, crystal grains at least in contact with the electrodes have dislocation layers in the grains. In addition, all the crystal grains in contact with the electrodes may not always have the dislocation layers in the grains. When some of the crystal grains in contact with the electrodes have the dislocation layers in the grains, an effect can be obtained.

Figure 1A:
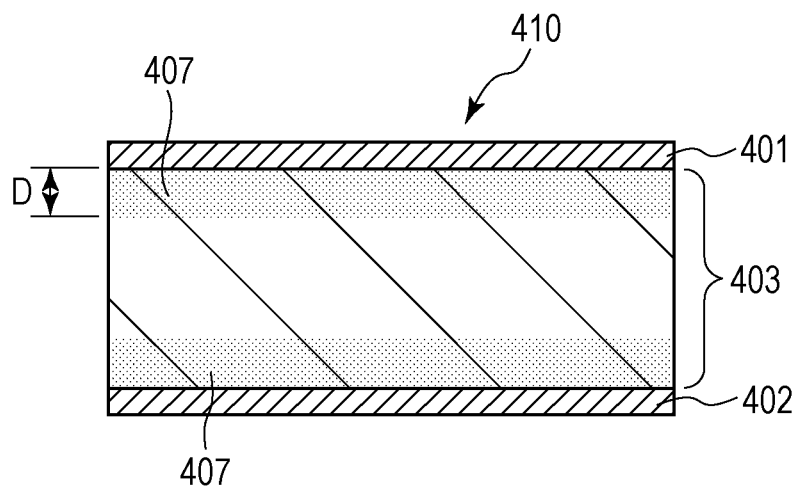
FIG. 1A is a schematic cross-sectional view showing one embodiment of the structure of a piezoelectric element of the present invention.
Figure 1B:
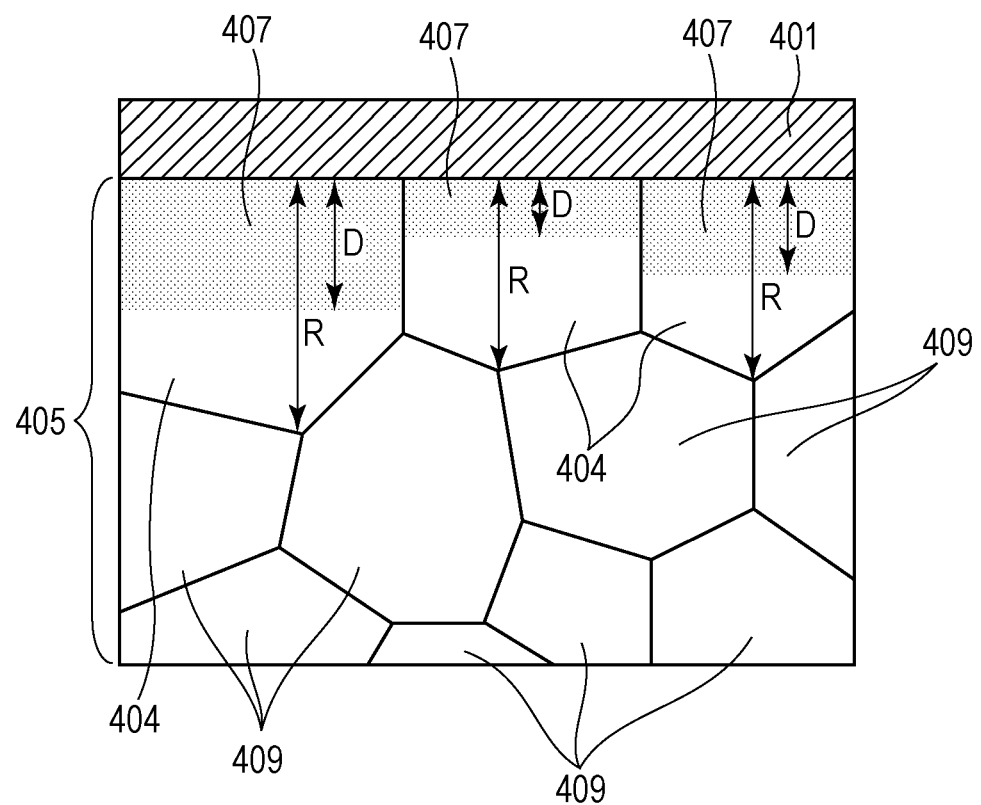
FIG. 1B is an enlarged schematic cross-sectional view showing the embodiment of structure of the piezoelectric element of the present invention.

FIGS. 1A and 1B are schematic cross-sectional views each showing one embodiment of the structure of the piezoelectric element of the present invention.

As shown in FIG. 1A, a piezoelectric element 410 of the present invention at least has a pair of electrodes 401 and 402 and a piezoelectric material 403 provided in contact with the pair of electrodes. The piezoelectric material 403 has dislocation layers 407 in the vicinity of part of the interface with the electrode 401. In particular, the piezoelectric material 403 is formed of an aggregate 405 of crystal grains containing barium titanate as a primary component. Among the crystal grains of the aggregate 405, crystal grains 404 which are in contact with the electrodes have the dislocation layers 407 in contact with the above electrodes 401 and 402 in the grains.

The pair of electrodes 401 and 402 is formed of a conductive layer having a thickness of approximately 5 to 2,000 nm. A material of the electrodes is not particularly limited, and any materials generally used for piezoelectric elements may be used. For example, metals, such as Ti, Pt, Ta, Ir, Sr, In, Sn, Au, Al, Fe, Cr, Ni, Pd, Ag, and Cu, and oxides thereof may be mentioned. The pair of electrodes 401 and 402 may be formed from one of those mentioned above or may have a laminate structure formed from at least two of those mentioned above. The electrodes 401 and 402 may be formed from different materials from each other.

A method for manufacturing electrodes is not limited, and the electrodes may be formed by baking a metal paste or may be formed by using a sputtering method, a deposition method, or the like. In addition, the electrodes each may be patterned to have a desired shape for the use.

The piezoelectric material 403 is formed of the aggregate 405 of crystal grains. An aggregate of crystal grains is the same as a polycrystal. FIG. 1B is an enlarged schematic cross-sectional view of the piezoelectric element 410 shown in FIG. 1A in the vicinity of the electrode. The piezoelectric material 403 in FIG. 1A corresponds to the aggregate 405 of crystal grains shown in FIG. 1B. The crystal grains of this embodiment include the crystal grains 404 in contact with the electrode 401 and crystal grains 409 not in contact with the electrode 401.

Each crystal grain forming the piezoelectric material 403 contains barium titanate as a primary component. That is, the piezoelectric material 403 itself also contains barium titanate as a primary component. The barium titanate is preferably an $ABO_3$ type perovskite crystal represented by general formula $BaTiO_3$.

The primary component means that a primary component responsible to exhibit the piezoelectric properties is barium titanate. For example, property adjusting components, such as manganese, and/or impurity components inevitably incorporated during manufacturing may be contained in the piezoelectric material or the crystal grains.

In particular, the content of barium titanate contained in the piezoelectric material 403 or the crystal grains is 95 percent by mass or more, preferably 97 percent by mass or more, and more preferably in a range of 99 to 99.96 percent by mass. The content of components other than barium titanate contained in the piezoelectric material 403 is preferably decreased to less than 5 percent by mass. When the content of components having no contribution to the piezoelectric properties is more than 5 percent by mass, the total piezoelectricity of the piezoelectric material 403 may become insufficient in some cases.

The barium (Ba) site of barium titanate may be partially substituted with a different divalent metal or a pseudo-divalent metal. As an example of the divalent metal which can substitute the Ba site, for example, Ca or Sr may be mentioned. As the pseudo-divalent metal which can substitute the Ba site, for example, $(Bi_{0.5}Na_{0.5})$, $(Bi_{0.5}K_{0.5})$, $(Bi_{0.5}Li_{0.5})$, $(La_{0.5}Na_{0.5})$, $(La_{0.5}K_{0.5})$, and $(La_{0.5}Li_{0.5})$ may be mentioned. When the Ba site is partially substituted with a different divalent metal or pseudo-divalent metal, the substitution rate is 20 percent by atom or less and preferably 10 percent by atom or less. When the substitution rate is more than 20 percent by atom, high intrinsic piezoelectric properties of barium titanate may not be sufficiently obtained in some cases.

The titanium (Ti) site of barium titanate may be partially substituted with a different tetravalent metal or pseudo-tetravalent metal. As an example of the tetravalent metal which can substitute the Ti site, for example, Zr, Hf, Si, Sn, and Ge may be mentioned. As an example of the pseudo-tetravalent metal which can substitute the Ti site, for example, a combination $(M^{2+}_{1/3}M^{5+}_{2/3})$ of a divalent metal and a pentavalent metal, a combination $(M^{3+}_{1/2}M^{5+}_{1/2})$ of a trivalent metal and a pentavalent metal, and a combination $(M^{3+}_{2/3}M^{6+}_{1/3})$ of a trivalent metal and a hexavalent metal may be mentioned. Although any tetravalent metal may be arranged at the Ti site, Ti element is particularly preferable. As a preferable composition of crystal grains forming a piezoelectric material and the piezoelectric material 403 of the present invention, for example, $(Ba_{1-x}Ca_x)_a(Ti_{1-y}Zr_y)O_3$ ($0.95 \leq a \leq 1.05$, $0.02 \leq x \leq 0.30$, $0.020 \leq y \leq 0.095$, $y \leq x$) may be mentioned. A piezoelectric material having the above composition can stably perform piezoelectric drive in a wide temperature range.

In the present invention, the "dislocation" indicates one type of linear crystal defect. Plastic deformation of crystal occurs when the crystal slips along an atomic plane (slip plane). In this case, all the atoms on the slip plane do not slip at the same time, and since individual atoms slightly slip, slips locally progress, so that the whole region finally slips.

The atomic arrangement is locally disordered at the boundary between a region in which slips occur and a region in which no slips occur. This local disorder is the dislocation. Since being linearly and continuously connected to each other, the dislocations are called a dislocation line in some cases.

The "dislocation layer" in the present invention indicates a region in which dislocations are accumulated at high density.

Since being a local disorder of the atom arrangement, the dislocation can be regarded to function as a one-dimensional crystal grain boundary. The inside of the dislocation layer is formed of dislocations at high density and regions defined by the dislocations (although being not completely surrounded thereby). That is, the dislocation layer can be regarded as a region in which grain diameters are apparently decreased by the dislocations. Therefore, the piezoelectric constant is increased by a local dislocation layer.

The dislocation layer may cause a decrease in mechanical strength in some cases. However, since the dislocation layers are in contact with the electrode, the strength is maintained because the dislocation layers are capped with the electrode.

As one example of a method for observing dislocations and dislocation layers, for example, a transmission electron microscope (TEM) may be mentioned. In the periphery of the dislocation, the crystal lattice is locally distorted. That is, the crystal orientation to electron beam at a portion having no dislocations is slightly different from that at a peripheral portion of the dislocations. Therefore, the dislocations can be easily confirmed by an observation method reflecting a diffraction contrast of a bright field image, a dark field image, or the like.

In addition, the dislocations can also be observed using a scanning transmission electron microscope (STEM). In a STEM, a scattering angle range of electrons fed to a detector can be changed by changing a camera length. When electrons scattered at a high angle are fed, an image (Z contrast image) reflecting the atomic number of a sample can be obtained. On the other hand, when electrons scattered at a low angle are fed, an image reflecting a diffraction contrast can be obtained. The reason for this is that an intensive low-index diffracted wave is directly fed to the detector. Therefore, the dislocations can be easily confirmed by observation by adjusting the camera length.

The crystal grains 404 in contact with the electrode 401 preferably have smooth surfaces in direct contact therewith obtained, for example, by polishing. In that case, the depth of the crystal grain 404 measured in a direction perpendicular to the electrode 401 is smaller than the grain diameter before polishing. In this embodiment, the depth of each crystal grain measured in the direction perpendicular to the electrode is represented by a grain diameter R in a perpendicular direction. A thickness D of the dislocation layer is represented by the length of the dislocation layer 407 from an electrode side as shown in FIG. 1B.

In the present invention, among the crystal grains having the dislocation layers, in crystal grains having a grain diameter R of 2 μm or more in a direction perpendicular to the electrode, the thickness D of the dislocation layer is preferably equivalent to or less than the grain diameter R. As described above, the effect of the present invention is obtained when the grain diameters are apparently decreased by the dislocation layers. When the grain diameter R is smaller than 2 μm, since the grain diameter is small from the beginning, a significant effect of the dislocation layers according to the present invention cannot be obtained. In addition, the thickness D of the dislocation layer is more preferably in a range of 120 nm to the grain diameter R. When the thickness D is smaller than 120 nm, the effect of the dislocation layers may not be sufficiently obtained in some cases.

That is, the piezoelectric element of the present invention is a piezoelectric element at least formed of a pair of electrodes and a piezoelectric material, the piezoelectric material is an aggregate of crystal grains containing barium titanate as a primary component, and among crystal grains which are in contact with the electrodes and which contain barium titanate as a primary component, crystal grains having a grain diameter R of 2 μm or more in a direction perpendicular to each of the electrodes have the dislocation layers in the grains.

In addition, all crystal grains which have a grain diameter R of 2 μm or more and which are in contact with the electrodes may not always have the dislocation layers in the grains. When some crystal grains which have a grain diameter R of 2 μm or more and which are in contact with the electrodes have the dislocation layers in the grains, the effect can be obtained. In addition, some crystal grains which have a grain diameter R of less than 2 μm and which are in contact with the electrodes may also be present, and the dislocation layers 407 may also be present in these relatively small crystal grains.

In addition, the dislocation layers may be present in all the crystal grains in contact with the electrodes and may be continuously extended to adjacent crystal grains located at an opposite side to each of the electrodes. However, if the dislocation layer is extended to penetrate the piezoelectric material, it is not preferable since the mechanical strength of the piezoelectric material is decreased (becomes fragile).

When a cross section of the dislocation layer is observed, the length of a contact portion thereof with the electrode is preferably 300 nm or more.

In addition, the dislocation layers in each crystal grain are preferably polarized in the same direction. If the polarization directions differ from each other in each crystal grain, it is not preferable in view of improvement of the piezoelectric properties.

In addition, Young's modulus of a surface portion of the piezoelectric material in contact with the electrode is preferably lower than that of the whole piezoelectric material. In general, it has been known that as the grain diameter is decreased, the size of domains of a piezoelectric substance is decreased. In addition, it has also been known that as the size of domains is decreased, Young's modulus is decreased.

A piezoelectric constant $d_{31}$ is defined by the following formula 1.

$$d_{31} = k_{31}\sqrt{s_{11}^E \cdot \epsilon_{33}^T} \quad \text{[Formula 1]}$$

In the above formula, $k_{31}$ indicates the electromechanical coupling coefficient, $s_{11}^E$ indicates the elastic compliance, and $\epsilon_{33}^T$ indicates the dielectric constant. The elastic compliance is the inverse of Young's modulus. Therefore, if Young's modulus is decreased, the elastic compliance is increased, and the piezoelectric constant is increased.

In addition, the piezoelectric material preferably contains a manganese component. The ratio of the manganese component to the barium titanate component is preferably in a range of 0.04 to 0.20 percent by mass. The ratio is more preferably in a range of 0.05 to 0.17 percent by mass. When the piezoelectric material contains a manganese component in the above range, the insulating properties and the mechanical quality factor (Qm) are improved. In addition, degradation caused by depolarization is not likely to occur. When the content of the manganese component is less than 0.04 percent by mass, the effect obtained by the addition of manganese cannot be obtained, and when the content is more than 0.20 percent by mass, since hexagonal barium titanate having inferior piezoelectricity may be unfavorably mixed in the piezoelectric material, the piezoelectricity of the whole piezoelectric material may become insufficient in some cases.

In addition, the distance between the pair of electrodes, that is, the thickness of the piezoelectric material, is preferably in a range of 50 μm to 10 mm. If the average value of the above distance is less than 50 μm, when the piezoelectric material is used as a piezoelectric element, the mechanical strength thereof may become insufficient in some cases. On the other hand, when the above average value is more than 10 mm, since the ratio of the dislocation layers to the whole piezoelectric material is excessively decreased, the effect of improving the piezoelectric constant is not fully obtained.

Hereinafter, a method for manufacturing the piezoelectric element of the present invention will be described.

For a piezoelectric material used for the piezoelectric element of the present invention, there may be used a general method for sintering at ordinary pressure a solid powder, such as an oxide, a carbonate, a nitrate, or an oxalate, containing at least barium and titanium as constituent elements. For example, the piezoelectric material can be obtained by performing a sintering treatment of raw material grains of barium titanate. When the barium titanate grains contain 0.04 to 0.20 percent by mass of a manganese component in terms of metal conversion, the insulating properties and Qm of the piezoelectric material after the sintering are improved.

In this embodiment, the state of manganese present in the raw material grains of barium titanate is not particularly limited. For example, manganese may be solid-solved in barium titanate. Alternatively, manganese in the form of a metal element, an ion, an oxide, a metal salt, a complex, or the like may adhere to the raw material grains of barium titanate.

The raw material grains of barium titanate may also contain, besides barium titanate and manganese, property adjusting components and/or impurity components inevitably incorporated during synthesis. As the impurity components, for example, metal-containing components containing at least one of aluminum, calcium, niobium, iron, lead, and the like; glass components; and hydrocarbon-based organic components may be mentioned. The content of the impurity components is preferably 5 percent by mass or less. The content of the impurity components is more preferably 1 percent by mass or less.

The grain diameter of the raw material grains as a primary grain is not particularly limited. However, in order to obtain a high-density and homogeneous piezoelectric material, the average grain diameter of the primary grains is preferably in a range of 5 to 300 nm and more preferably in a range of 50 to 150 nm. In both cases in which the grain diameter of the primary grains is excessively small and excessively large, the density of the piezoelectric material after sintering may be insufficient in some cases. In this embodiment, among the grains forming a powder substance, the primary grains indicate minimum unit grains which can be clearly discriminated from the other grains. The primary grains may aggregate to form larger secondary grains. By a granulation process using a polymer binder, secondary grains may be intentionally formed.

In the present invention, a method for manufacturing grains used as a raw material is not particularly limited. In the case of barium titanate adhered with manganese, a manganese component may be added in a subsequent step to commercially available or synthesized barium titanate grains so as to adhere thereto. Although a method for adding a manganese component is not particularly limited, the manganese component preferably uniformly adheres to the surface of barium titanate. From this point of view, the most preferable addition method is a spray dry method.

In the case of barium titanate in which manganese is solid-solved, the raw material grains may be manufactured by crystallizing a barium titanate precursor containing a manganese component in advance. For example, after a barium compound and a titanium compound are mixed together at an equimolar ratio, a manganese component in a desired amount is added to the mixture, and calcining is performed at approximately 1,000° C., so that raw material grains of barium titanate containing a solid-solved manganese component can be obtained.

In this embodiment, as a barium compound usable for manufacturing the raw material grains, for example, barium carbonate, barium oxalate, barium oxide, barium aluminate, and various types of barium alkoxides may be mentioned.

In addition, as a titanium compound usable for manufacturing the raw material grains, for example, titanium oxide may be mentioned.

As a manganese component usable for manufacturing the raw material grains, for example, manganese compounds, such as manganese oxide, manganese dioxide, and manganese acetate, may be mentioned. In addition, as a calcium component usable when it is contained in the raw material grains of the piezoelectric material of the present invention, for example, calcium oxide, calcium carbonate, a calcium oxalate, and calcium acetate may be mentioned. As a zirconium component usable when it is contained in the raw material grains of the piezoelectric material of the present invention, for example, zirconium oxide may be mentioned. The calcium component and the zirconium component may be solid-solved in the raw material grains of barium titanate or may be added thereto to form a mixture. In addition, the raw material grains may be manufactured using barium titanate, barium zirconate, calcium titanate, and calcium zirconate, each of which is commercially available for industrial use.

The raw material grains of barium titanate is molded into a desired shape and is then processed by a sintering treatment, so that a piezoelectric material formed of an aggregate of crystal grains is formed.

A sintering method of a piezoelectric material is not limited in the present invention. As the sintering method, for example, a sintering method using an electrical furnace, an electrical heating method, a microwave sintering method, a milliwave sintering method, and a hot isostatic press (HIP) method may be mentioned.

In the present invention, although a sintering temperature of the piezoelectric material is not limited, a temperature at which crystal growth of barium titanate is fully performed is preferable. The sintering temperature is preferably in a range of 1,000° C. to 1,450° C. and is more preferably in a range of 1,300° C. to 1,400° C.

In order to reproducibly stabilize the properties of the piezoelectric material obtained by a sintering treatment, a sintering treatment is preferably performed for approximately 1 to 12 hours while the sintering temperature is maintained constant in the range described above.

The sintered piezoelectric material can be processed by polishing to have a desired thickness. Although polishing conditions are not limited, a finishing process is preferably performed by buffing using colloidal silica. The reason for this is that in order to apply a uniform electric field in a subsequent polarization treatment, a flat surface having a small number of defects is preferable. By the buffing, a smooth surface on the order of nanometers and a surface rarely having macroscopic crystal defects (including dislocations) can be obtained.

On the ceramic thus polished, a pair of electrodes is formed for the polarization treatment. A method for forming the electrodes is not limited, and a metal paste may be baked, or a sputtering or a deposition method may be used. In addition, in consideration of the conditions of the polarization treatment, the electrodes each may be patterned into a desired shape.

In the present invention, although the conditions of the polarization treatment are not limited, an electric field density of 1 kV/mm or more is preferably applied. In addition, in order to prevent electrical discharge, the polarization treatment may be performed in an insulating silicone oil.

In the present invention, although it is necessary to peel off the electrodes used for the polarization treatment to introduce dislocations, a peeling method is not particularly limited. For example, either polishing or etching may be used. In the case of gold electrodes, a known etching solution, such as an $I_2$+KI aqueous solution, may be used.

In the present invention, a method for introducing dislocations is not particularly limited. For example, a polishing method may be mentioned. If the surface is polished using abrasive paper in an approximate range of from grain size No. 800 to No. 2500, dislocation layers having a depth of approximately 1 to 5 μm from the surface can be introduced.

The piezoelectric element of the present invention is manufactured by again forming a pair of electrodes on the piezoelectric material in which the dislocation layers are introduced. The pair of electrodes formed in this case may be similar to the pair of electrodes used for the polarization treatment.

Figure 2A:
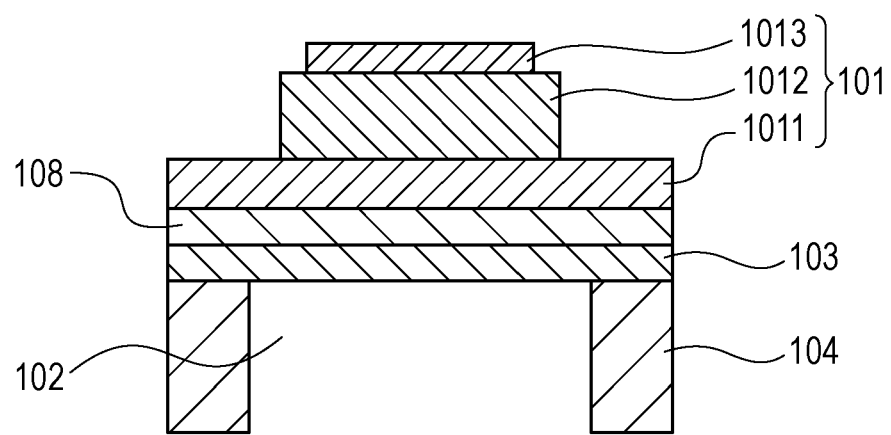
FIG. 2A is a schematic cross-sectional view showing one embodiment of the structure of a liquid discharge head of the present invention.
Figure 2B:
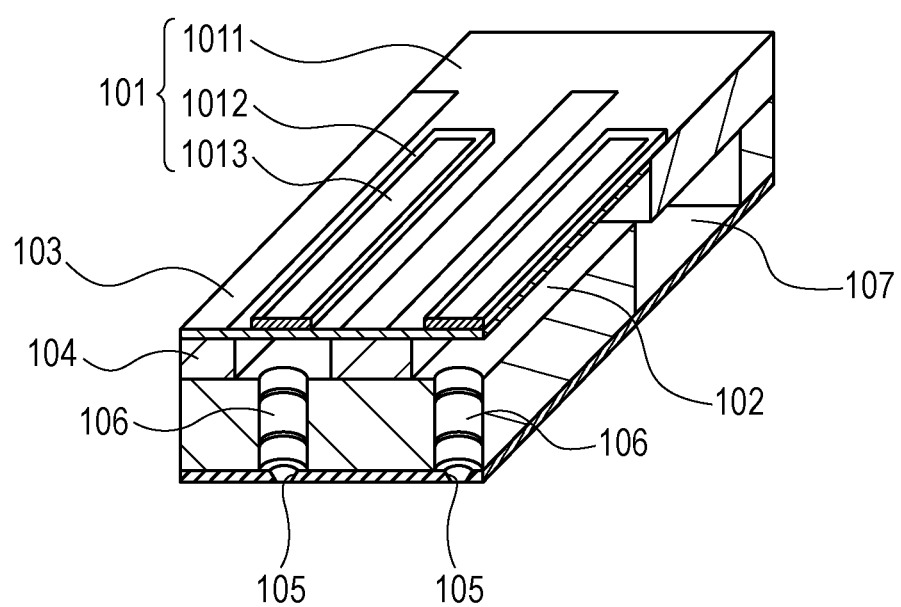
FIG. 2B is a schematic view showing the embodiment of the structure of the liquid discharge head of the present invention.

FIGS. 2A and 2B are schematic views each showing one embodiment of the structure of a liquid discharge head of the present invention. As shown in FIGS. 2A and 2B, the liquid discharge head of the present invention is a liquid discharge head having a piezoelectric element 101 of the present invention. The piezoelectric element 101 is a piezoelectric element at least having a first electrode 1011, a piezoelectric material 1012 in which dislocation layers are locally introduced, and a second electrode 1013. The piezoelectric material 1012 is patterned as shown in FIG. 2B, if needed.

FIG. 2B is a schematic view of the liquid discharge head. The liquid discharge head has a discharge port 105, an independent liquid chamber 102, a communicating hole 106 connecting between the independent liquid chamber 102 and the discharge port 105, a liquid chamber partition 104, a common liquid chamber 107, a vibrating plate 103, and the piezoelectric element 101. Although the piezoelectric element 101 has a rectangular shape as shown in the figure, besides the rectangle, any shapes, such as an oval, a circle, and a parallelogram, may be used. In general, the piezoelectric material 1012 has a shape in conformity with the shape of the independent liquid chamber 102.

With reference to FIG. 2A, the vicinity of the piezoelectric element 101 included in the liquid discharge head of the present invention will be described in detail. FIG. 2A is a cross-sectional view of the piezoelectric element in a width direction of the liquid discharge head shown in FIG. 2B. Although the sectional shape of the piezoelectric element 101 has a rectangular shape as shown in the figure, for example, a trapezoid or an inverted trapezoid may also be used.

In the figure, the first electrode 1011 is used as a lower electrode, and the second electrode 1013 is used as an upper electrode. However, the arrangement of the first electrode 1011 and the second electrode 1013 is not limited to that described above. For example, the first electrode 1011 may be used as a lower electrode or an upper electrode. As is the above case, the second electrode 1013 may be used as an upper electrode or a lower electrode. In addition, a buffer layer 108 may also be provided between the vibrating plate 103 and the lower electrode.

These differences of names are determined by different methods for manufacturing a device, and the effect of the present invention can be obtained in both cases.

In the above liquid discharge head, by expansion and contraction of the piezoelectric material 1012, the vibrating plate 103 is warped up and down, and hence, a pressure is applied to a liquid in the independent liquid chamber 102. As a result, the liquid is discharged from the discharge port 105. The liquid discharge head of the present invention can be used for printer applications and for manufacturing an electronic device.

The thickness of the vibrating plate 103 is in a range of 1.0 to 15 μm and is preferably in a range of 1.5 to 8 μm. Although a material of the vibrating plate is not limited, Si is preferably used. B and P may be doped into Si of the vibrating plate. In addition, the buffer layer and the electrode layer on the vibrating plate may function as a part of the vibrating plate.

The thickness of the buffer layer 108 is in a range of 5 to 300 nm and is preferably in a range of 10 to 200 nm.

The size of the discharge port 105 is in a range of to 40 μm in terms of an equivalent circular diameter. The shape of the discharge port 105 may be any one of a circular shape, a star shape, a square shape, and a triangle shape.

Next, an ultrasonic motor using the piezoelectric element of the present invention will be described.

Figure 3A:
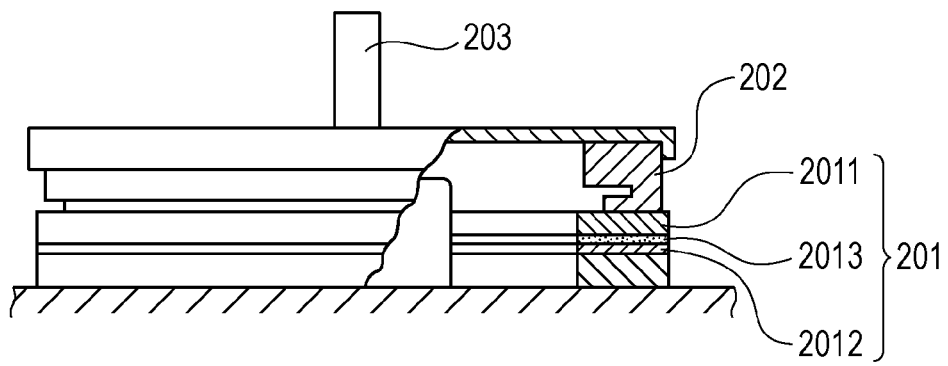
FIGS. 3A and 3B are schematic cross-sectional views showing one embodiment of the structure of an ultrasonic motor of the present invention.
Figure 3B:
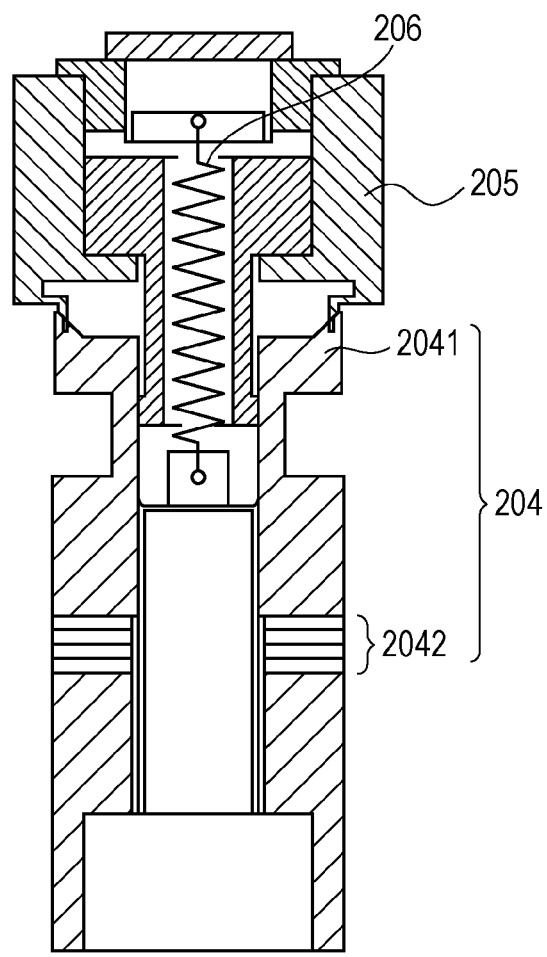

FIGS. 3A and 3B are schematic views each showing one embodiment of the structure of an ultrasonic motor of the present invention.

FIG. 3A shows an ultrasonic motor which uses a piezoelectric element of the present invention formed of a single plate. The ultrasonic motor includes a vibrator 201, a rotor 202 in contact with a sliding surface thereof with a pressure applied by a spring (not shown), and an output shaft 203 provided integrally with the rotor 202. The vibrator 201 is formed of a metal elastic ring 2011, a piezoelectric element 2012 of the present invention, and an organic adhesive 2013 (an epoxy, a cyanoacrylate, or the like) which adheres the piezoelectric element 2012 to the elastic ring 2011. The piezoelectric element 2012 of the present invention is formed of a piezoelectric material provided between a first electrode and a second electrode, each of which is not shown in the figure. Dislocation layers are locally introduced into the piezoelectric material.

If a two-phase alternating voltage with a phase different of $\pi/2$ is applied to the piezoelectric element of the present invention, a flexural traveling wave is generated in the vibrator 201, and each point on the sliding surface of the vibrator 201 performs an elliptic movement. If the rotor 202 is in pressure contact with the sliding surface of this vibrator 201, the rotor 202 receives a frictional force from the vibrator 201 and will rotate in a direction opposite to that of the flexural traveling wave. A driven body not shown in the figure is joined to the output shaft 203 and is driven by a rotative force of the rotor 202.

When a voltage is applied to a piezoelectric material, the piezoelectric material is expanded and contracted by a piezoelectric transversal effect. When an elastic body, such as a metal, is joined to a piezoelectric element, the elastic body is warped by expansion and contraction of the piezoelectric material. The type of ultrasonic motor described above is an ultrasonic motor which uses this principle.

Next, an ultrasonic motor containing a piezoelectric element of a laminate structure will be described by way of example with reference to FIG. 3B. A vibrator 204 is formed of a laminate piezoelectric element 2042 provided between cylindrical metal elastic bodies 2041. The laminate piezoelectric element 2042 is an element formed of piezoelectric materials (not shown) laminated to each other and has a first electrode and a second electrode on laminate external surfaces and inner electrodes on laminate internal surfaces. The metal elastic bodies 2041 are joined to each other with a bolt to hold the piezoelectric element 2042 therebetween, thereby forming the vibrator 204.

By applying alternating voltages having different phases to the piezoelectric element 2042, the vibrator 204 excites two vibrations orthogonal to each other. These two vibrations are synthesized into a circular vibration to drive a front portion of the vibrator 204. In addition, a circumferential groove is formed in an upper portion of the vibrator 204 so as to increase the displacement of the vibration for the drive.

A rotor 205 is in pressure contact with the vibrator 204 by a spring 206 to obtain a frictional force for the drive. The rotor 205 is rotatably supported by a bearing.

Next, a dust removing device using the piezoelectric element of the present invention will be described.

Figure 7A:
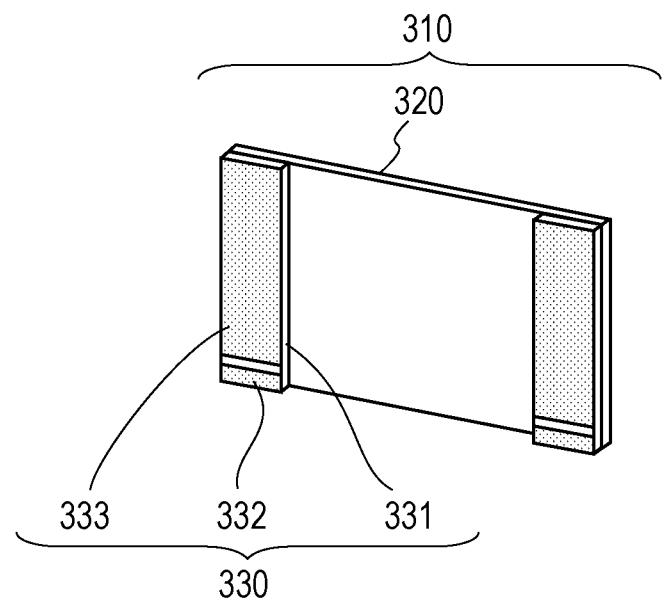
FIGS. 7A and 7B are schematic views showing one embodiment of a dust removing device of the present invention.
Figure 7B:
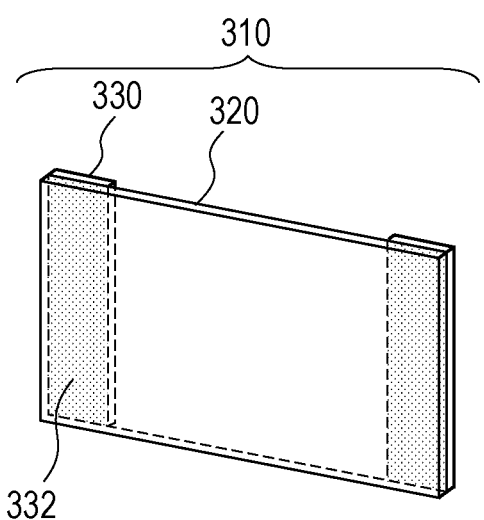

FIG. 7A and FIG. 7B are schematic views showing one embodiment of a dust removing device of the present invention. A dust removing device 310 is formed of plate-shaped piezoelectric elements 330 and a vibrating plate 320. Although a material of the vibrating plate 320 is not limited, when the dust removing device 310 is used for an optical device, a translucent material or a light reflection material may be used for the vibrating plate 320.

Figure 8:
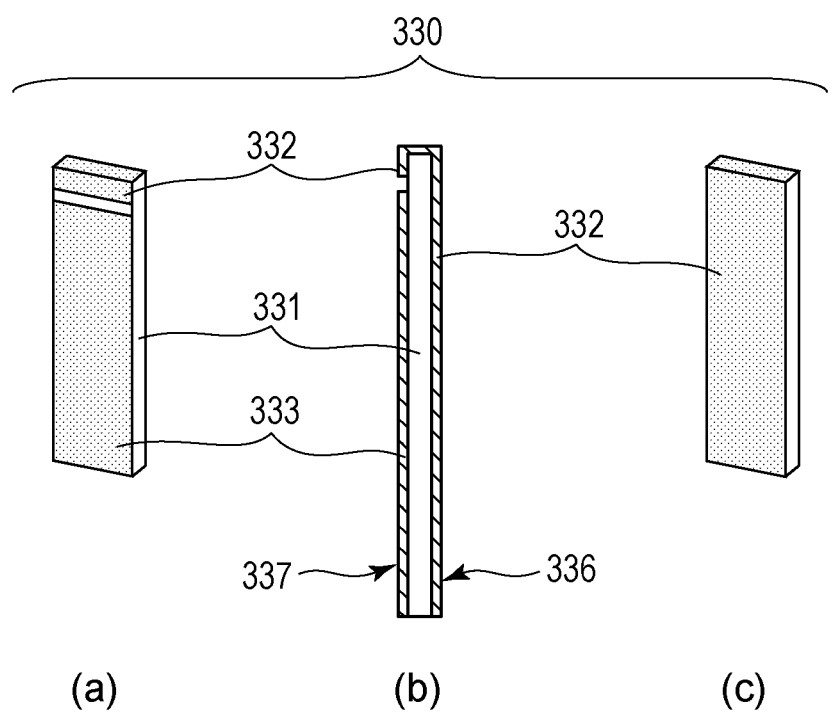
FIG. 8 is a schematic view showing the structure of the piezoelectric element of the present invention shown in FIGS. 7A and 7B.

FIG. 8 is a schematic view showing the structure of the piezoelectric element 330 shown in FIGS. 7A and 7B. Parts (a) and (c) of FIG. 8 show a front surface and a rear surface of the piezoelectric element 330, respectively, and a part (b) of FIG. 8 shows a side surface. As shown in FIGS. 7A and 7B, the piezoelectric element 330 is formed of a piezoelectric material 331, a first electrode 332, and a second electrode 333, and the first electrode 332 and the second electrode 333 are disposed to face the respective surfaces of the piezoelectric material 331. Although not shown in the figures, dislocation layers are locally introduced into the piezoelectric material 331. A front surface of the piezoelectric element 330 shown in the part (c) of FIG. 8 at which the first electrode 332 is provided is represented by a first electrode surface 336, and a front surface of the piezoelectric element 330 shown in the part (a) of FIG. 8 at which the second electrode 333 is provided is represented by a second electrode surface 337.

In this case, the electrode surface of the present invention indicates the surface of the piezoelectric element at which the electrode is provided, and for example, as shown in FIG. 8, the first electrode 332 may be extended to the second electrode surface 337.

The piezoelectric element 330 is fixed to the vibrating plate 320 as shown in FIGS. 7A and 7B by fixing the first electrode surface 336 of the piezoelectric element 330 to the plate surface of the vibrating plate 320. In addition, a stress is generated between the piezoelectric element 330 and the vibrating plate 320 by the drive of the piezoelectric element 330, so that an out-of-plane vibration is generated in the vibrating plate. The dust removing device 310 of the present invention is a device to remove foreign materials, such as dust, adhering to the surface of the vibrating plate 320 by the out-of-plane vibration of the vibrating plate 320. The out-of-plane vibration indicates an elastic vibration which displaces the vibrating plate in an optical axis direction, that is, in the thickness direction of the vibrating plate.

Figure 9:
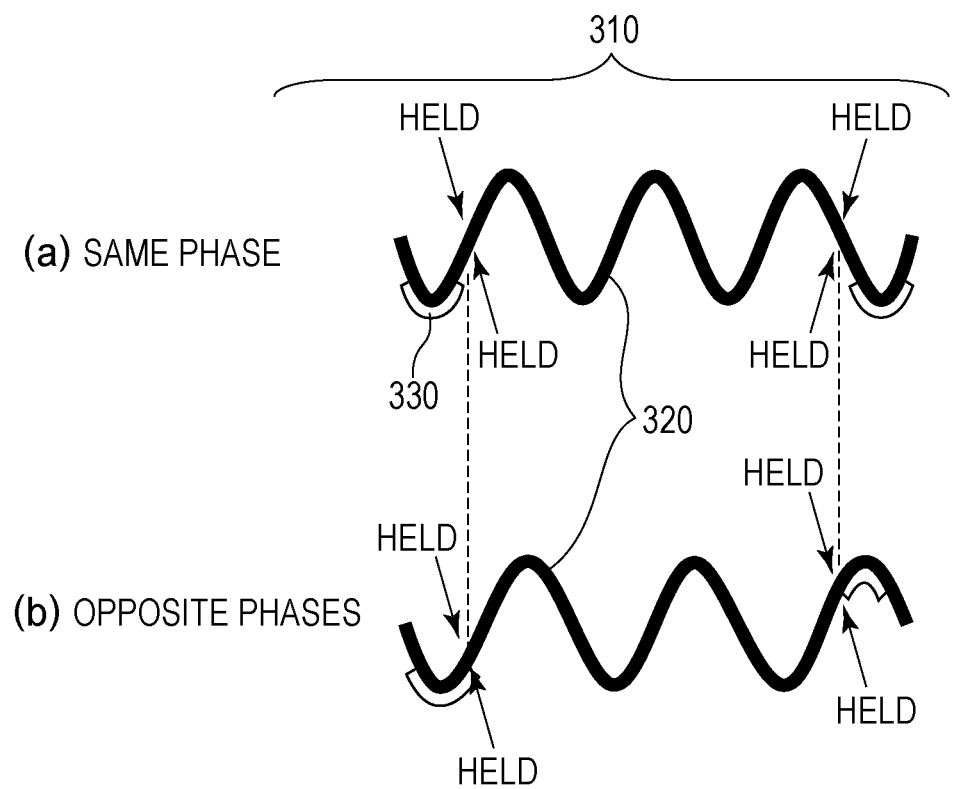
FIG. 9 is a schematic view showing a vibration principle of the dust removing device of the present invention.

FIG. 9 is a schematic view showing a vibration principle of the dust removing device 310 of the present invention. The part (a) of FIG. 9 shows the state in which alternating electric fields having the same phase are applied to the pair of piezoelectric elements 330 located in a right to left direction to generate the out-of-plane vibration in the vibrating plate 320. The polarization direction of the piezoelectric material forming the above pair of piezoelectric elements 330 is the same as the thickness direction of the piezoelectric element 330, and the dust removing device 310 is driven by the seventh vibration mode. The part (b) of FIG. 9 shows the state in which alternating electric fields having opposite phases by 180° are applied to the above pair of piezoelectric elements 330 located in the right to left direction to generate the out-of-plane vibration in the vibrating plate 320. The dust removing device 310 is driven by the sixth vibration mode. The dust removing device 310 of the present invention is a device capable of effectively removing dust adhering to the surface of the vibrating plate by selectively using at least two vibration modes.

As described above, the piezoelectric element of the present invention is suitably used for a liquid discharge head, an ultrasonic motor, or a dust removing device.

By using the non-lead piezoelectric material containing dislocation layers of the present invention, a liquid discharge head having a nozzle density and a discharge force, each of which is equivalent to or more than that of the case using a piezoelectric material containing lead, can be provided.

By using the non-lead piezoelectric material containing dislocation layers of the present invention, an ultrasonic motor having a drive force and durability, each of which is equivalent to or more than that of the case using a piezoelectric material containing lead, can be provided.

In addition, by using the non-lead piezoelectric material containing dislocation layers of the present invention, a dust removing device having a dust removing efficiency equivalent to or more than that of the case using a piezoelectric material containing lead can be provided.

Besides a liquid discharge head and a motor, the piezoelectric material of the present invention can also be used for devices, such as an ultrasonic vibrator, a piezoelectric actuator, a piezoelectric sensor, and a ferroelectric memory.

EXAMPLES

Hereinafter, with reference to Comparative Examples and Examples, the present invention will be described in more detail.

Example 1

A piezoelectric element which has dislocation layers and is added with manganese will be described by way of example.

Manganese acetate (II) was adhered to surfaces of barium titanate grains having an average grain diameter of 100 nm (trade name: BT-01, manufactured by Sakai Chemical Industry Co., Ltd.) by a spray dryer device, thereby forming a granular powder. According to an ICP mass analysis, the content of manganese of this powder was 0.12 percent by mass. The content of manganese was controllable by the ratio between raw materials to be fed to the spray dryer device. The granular powder was filled in a mold and was then compressed, so that a compact was formed.

The obtained compact was sintered to obtain a ceramic piezoelectric material. Firing was performed in air. First, the compact was held at 600° C. for 3 hours for degreasing. Furthermore, firing was performed at 1350° C. for 5 hours. A temperature rise rate was set to 10° C./min, and a thermocouple of an electrical furnace was adjusted so as to prevent overshoot higher than the sintering temperature by 10° C. or more.

X-ray diffraction measurement (XRD), fluorescence X-ray analysis (XRF), and density measurement by Archimedes method were performed on the piezoelectric material obtained as described above. As a result, it was found that the piezoelectric material was a perovskite single phase crystal primarily formed of barium titanate. The content of manganese of the whole piezoelectric material was 0.12 percent by mass in terms of metal conversion. The piezoelectric material had a preferable density value of 95% or more of the theoretical density of barium titanate.

A front and a rear surface of the piezoelectric material thus formed were polished until a desired thickness thereof is obtained. Abrasive paper of grain size No. 800 and abrasive paper of grain size No. 2000 were used in this order, and distilled water was used for cooling. Buffing using colloidal silica (grains diameter: 60 nm) was performed for a finishing process. The thickness of the piezoelectric material after the polishing was 120 μm.

By a DC sputtering method, gold electrodes were formed on the front and the rear surfaces of the piezoelectric material after the polishing. The electrode of Au thus formed had a thickness of 150 nm.

A polarization treatment was performed on the piezoelectric material provided with the electrodes. For the polarization conditions, the temperature was set to 100° C., a DC polarization electric field density was set to 1 kV/mm, and a voltage application time was set to 30 minutes.

After the polarization treatment was performed, the piezoelectric material was immersed in an etching solution (trade name: AURUM-100, manufactured by KANTO CHEMICAL CO., INC.) to remove the gold electrodes. Next, the two surfaces of the piezoelectric material from which the electrodes were removed were both polished with abrasive paper of grain size No. 2000. Accordingly, dislocation layers were introduced in the vicinity of the surfaces of the piezoelectric material.

Gold/titanium electrodes were formed on the two polished surfaces by a DC sputtering method. Titanium was provided at a piezoelectric material side to function as an adhesion layer. The electrodes thus formed each had Ti having a thickness of 20 nm and Au having a thickness of 150 nm.

By the steps as described above, a piezoelectric element having dislocation layers was obtained.

For measurement of the piezoelectric properties, a disc-shaped ceramic provided with the electrodes was obtained by cutting, so that a rectangular shape of 12 mm×3 mm×120 μm was formed.

The piezoelectric constant and Young's modulus of the piezoelectric element thus obtained were measured. In particular, the frequency dependence of impedance was measured using an impedance analyzer (trade name: 4294A, manufactured by Agilent Technologies). In addition, Young's modulus (GPa) and a piezoelectric constant $d_{31}$ (pm/V) were obtained from observed resonant frequency and antiresonant frequency. The piezoelectric constant $d_{31}$ is a constant having a negative value, and the piezoelectric performance is higher as the absolute value of the constant is increased.

A Young's modulus Y11 of the obtained piezoelectric element was 113 GPa, and the piezoelectric constant $d_{31}$ thereof was 71 pm/V.

Figure 4:
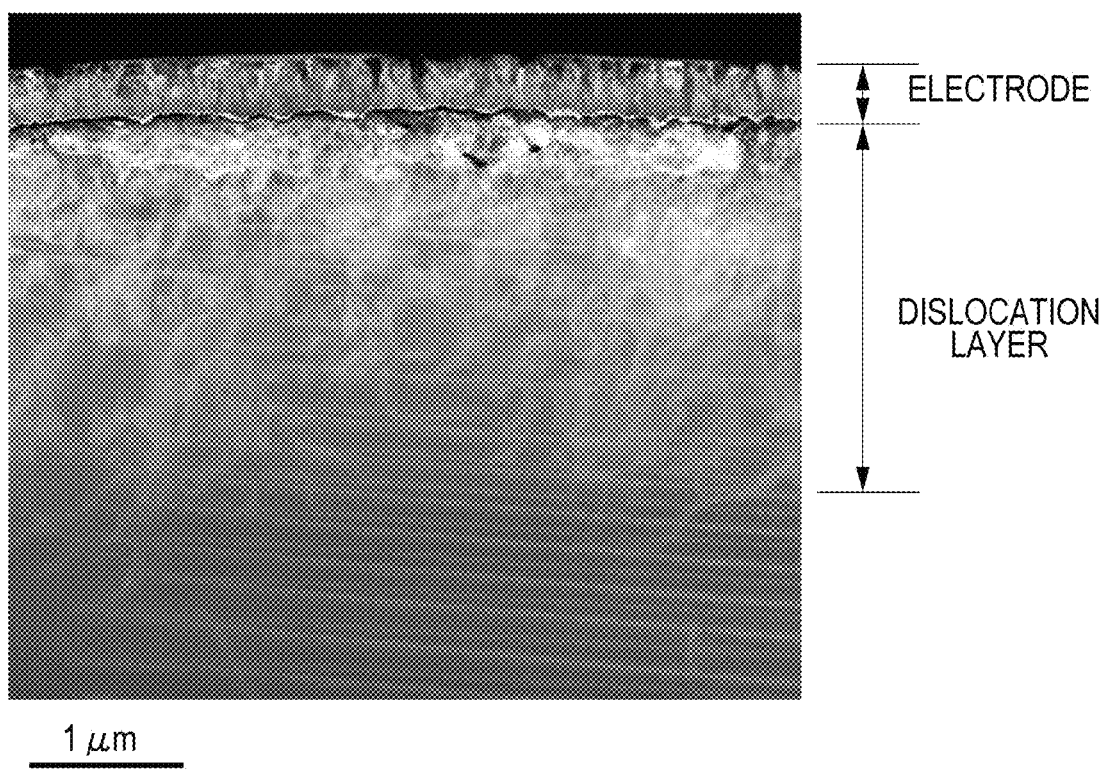
FIG. 4 is an image of a cross section of a piezoelectric element according to Example 1 of the present invention in the vicinity of an electrode, which is observed by a STEM.

FIG. 4 shows an image obtained when the cross section of the obtained piezoelectric element in the vicinity of the electrode is observed using the STEM. In this figure, a topmost layer structure is the electrode. Crystal grains are present under the electrode. Thin and bending linear textures present in the crystal grains in the vicinity of the electrode are dislocations (dislocation lines). A region in which dislocations are intricately entangled with each other is the dislocation layer. The periodic textures (bands each having a width of several hundreds nanometers) in a lateral direction are domains.

In addition, the grain diameters R of the crystal grains in contact with the electrode in the figure in a direction perpendicular to the electrode had a distribution of approximately 1 to 10 μm, and the majority of the crystal grains had a grain diameter R of 2 μm or more.

Figure 5:
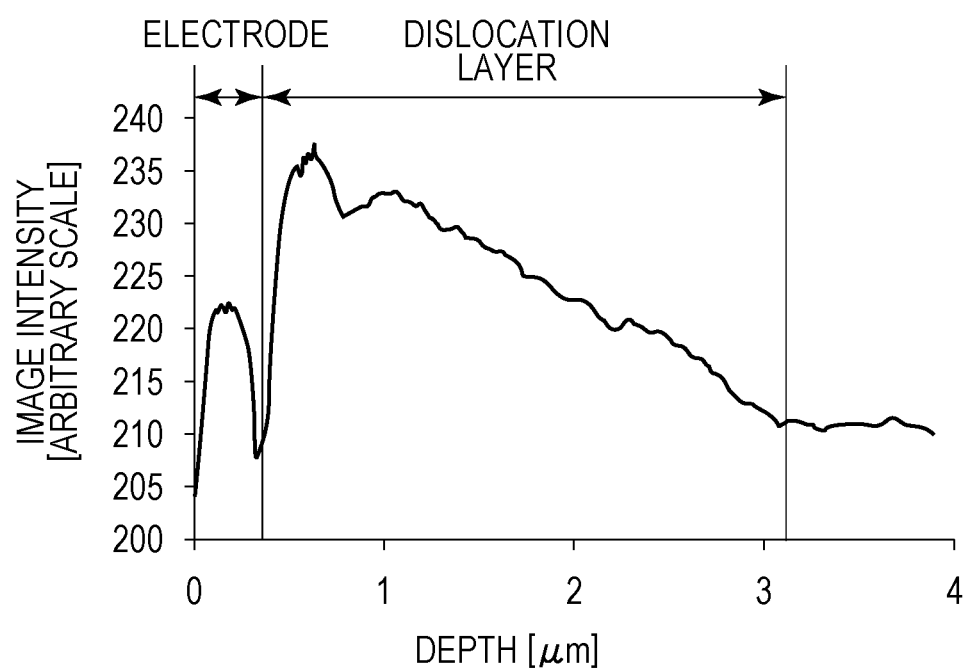
FIG. 5 is a graph showing an image intensity profile in a depth direction of FIG. 4.

FIG. 5 shows an image intensity profile of the image shown in FIG. 4 in a depth direction. In the dislocation layer, it can be confirmed that the image intensity is increased (brighter). The thickness of the dislocation layer in this case is 2.7 μm. When composition analysis was performed by energy dispersive X-ray spectroscopy (EDX), the difference in composition between a region having dislocation layers and a region having no dislocation layers was not observed.

Comparative Example 1

A piezoelectric element which has no dislocation layers and is added with manganese will be described by way of example.

After a process including a polarization treatment and preceding steps was performed in a manner similar to that of Example 1, without performing polishing, a piezoelectric element having no dislocation layers was obtained. A piezoelectric material was processed to have a rectangular shape of 12 mm×3 mm×120 μm.

Figure 6:
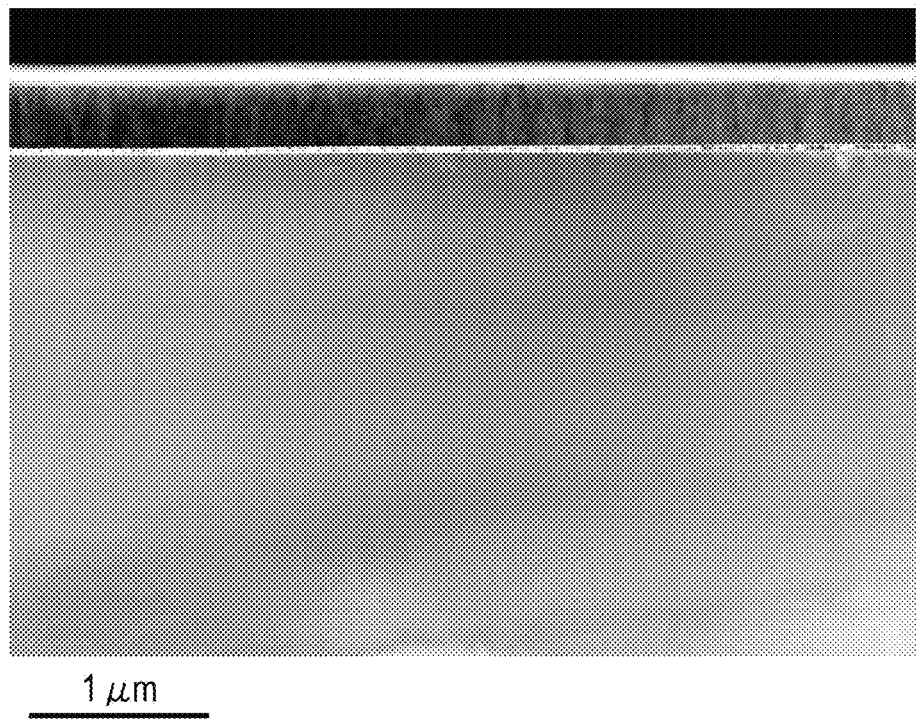
FIG. 6 is an image of a cross section of a piezoelectric element according to Comparative Example 1 in the vicinity of an electrode, which is observed by a STEM.

FIG. 6 shows an image obtained when the cross section of the obtained piezoelectric element in the vicinity of the electrode is observed using a STEM. It can be confirmed that no dislocation layers are present.

A Young's modulus Y11 of the obtained piezoelectric element was 125 GPa, and the piezoelectric constant $d_{31}$ was 61 pm/V.

From Example 1 and Comparative Example 1, it is found that by the presence of the dislocation layers of Example 1, Young's modulus is decreased and the piezoelectric constant is improved by approximately 16%. Young's modulus obtained by this measurement is a value of the whole sample. When a local Young's modulus in the vicinity of the surface was measured by a nanoindentation method, it was confirmed that in an area in which the dislocation layers were present, Young's modulus was locally decreased as compared to that in the other areas.

As described above, it was confirmed that the piezoelectric constant of the piezoelectric element is improved by introducing the dislocation layers.

Example 2

A piezoelectric element which has dislocation layers and is added with no manganese will be described by way of example.

A granular powder was obtained by a spray drier device using barium titanate grains having an average grain diameter of 100 nm (trade name: BT-01, manufactured by Sakai Chemical Industry Co., Ltd.) as raw material grains. In this example, manganese was not added, and this is a point different from Example 1.

Subsequent steps of introducing dislocation layers and forming electrodes were performed in a manner similar to that of Example 1, and the piezoelectric element of the present invention was obtained. A piezoelectric material was processed to have a rectangular shape of 12 mm×3 mm×1 mm. As in the case of Example 1, the cross section was observed by a STEM, and the XRD measurement, the XRF measurement, and the density measurement were performed.

As a result, the piezoelectric material included in the piezoelectric element of Example 2 was a perovskite single phase crystal containing barium titanate as a primary component. The grain diameters R of the crystal grains in a direction perpendicular to the electrode had a distribution of approximately 1 to 10 μm, and the majority of the crystal grains had a grain diameter R of 2 μm or more. In the crystal grains having a grain diameter R of 2 μm or more, dislocation layers having a thickness in a range of 150 nm to the grain diameter R were present. In addition, the piezoelectric material had a preferable density value of 95% or more of the theoretical density of barium titanate.

Comparative Example 2

A piezoelectric element which has no dislocation layers and is added with no manganese will be described by way of example.

A process including a polarization treatment and preceding steps was performed in a manner similar to that of Example 2, so that a piezoelectric element having no dislocation layers was obtained. A piezoelectric material was processed to have a rectangular shape of 12 mm×3 mm×1 mm.

As in the case of Example 1, the frequency dependence of impedance of each of the piezoelectric elements of Example 2 and Comparative Example 2 was measured. Since the polarization switching of each element was not satisfactory, the piezoelectric constant and Young's modulus were not accurately obtained; however, it was suggested that the piezoelectric constant of Example 2 was relatively increased by approximately 3% as compared to that of Comparative Example 2.

Example 3

A piezoelectric element which is formed of small diameter grains, have dislocation layers, and is added with manganese will be described by way of example.

A piezoelectric element of the present invention was obtained in a manner similar to that of Example 1 except the following sintering conditions were used. As for the sintering conditions, first, degreasing was performed at 600° C. for 3 hours. Subsequently, the temperature was increased to 1,010° C. at a rate of 10° C./min and was held at 1,010° C. for 3 hours.

Subsequently, after the temperature was increased to 1,420° C. at a rate of 20° C./min and was then held for 1 minute, the temperature was decreased to 1,010° C. at a rate of 20° C./min and was then held for 3 hours. The step of increasing the temperature from 1,010° C. to 1,420° C. and the step of decreasing the temperature from 1,420° C. to 1,010° C. were repeatedly performed. Subsequently, after being held at 1,010° C. for 10 hours, the temperature was spontaneously decreased to room temperature.

Since the maximum attained temperature was maintained for a short period of time, an obtained piezoelectric material was formed of relatively small crystal grains.

Subsequent steps of introducing dislocation layers and forming electrodes were performed in a manner similar to that of Example 1, so that the piezoelectric element of the present invention was obtained. The piezoelectric material was processed to have a cylindrical shape having a diameter of 10 mm and a thickness of 10 mm. As in the case of Example 1, the cross section was observed by a STEM, and the XRD measurement, the XRF measurement, and the density measurement were performed.

As a result, the piezoelectric material included in the piezoelectric element of Example 3 was a perovskite single phase crystal containing barium titanate as a primary component. The grain diameters R of the crystal grains in contact with the electrode in a direction perpendicular thereto had a distribution of approximately 2 to 5 µm, and almost all the crystal grains in contact with the electrode had a grain diameter R of 2 µm or more. In the crystal grains having a grain diameter R of 2 µm or more, dislocation layers having a thickness in a range of 120 nm to the grain diameter R were present. In addition, the piezoelectric material had a preferable density value of 97% or more of the theoretical density of barium titanate.

Comparative Example 3

A piezoelectric element which is formed of small diameter grains, has no dislocation layers, and is added with manganese will be described by way of example.

A process including a polarization treatment and preceding steps was performed in a manner similar to that of Example 3, so that a piezoelectric element having no dislocation layers was obtained. A piezoelectric material was processed to have a cylindrical shape having a diameter of 10 mm and a thickness of 10 mm.

The piezoelectric properties of the piezoelectric elements of Example 3 and Comparative Example 3 were evaluated using a $d_{33}$ meter (Piezo Meter System, manufactured by PIEZOTEST). As a result, since the piezoelectric constants $d_{33}$ of Example 3 and Comparative Example 3 were 500 pm/V and 485 pm/V, respectively, it was confirmed that the piezoelectric constant tended to be improved by the presence of the dislocation layers.

Example 4

A piezoelectric element which is formed of barium titanate containing a calcium component and a zirconium component, has dislocation layers, and is added with manganese will be described by way of example.

Barium titanate grains having an average grain diameter of 100 nm (trade name: BT-01, manufactured by Sakai Chemical Industry Co., Ltd.), calcium titanate grains having an average grain diameter of 300 nm (trade name: CT-03, manufactured by Sakai Chemical Industry Co., Ltd.), and calcium zirconate grains having an average grain diameter of 300 nm (trade name: CZ-03, manufactured by Sakai Chemical Industry Co., Ltd.) were mixed together at a molar ratio of 85:10:5, respectively. Manganese acetate (II) was adhered to surfaces of the mixed grains using a spray drier device, thereby forming a granular powder. According to an ICP mass analysis, the content of manganese of this powder was 0.18 percent by mass. Subsequently, introduction of dislocation layers and formation of electrodes were performed in a manner similar to that of Example 1, thereby forming the piezoelectric element of the present invention. According to the XRF measurement, it was found that the composition of a piezoelectric material included in this piezoelectric element was $(Ba_{0.85}Ca_{0.15})(Ti_{0.95}Zr_{0.05})O_3$ containing 0.18 percent by mass of manganese in terms of metal conversion.

The piezoelectric material was processed to have a rectangular shape of 12 mm×3 mm×1 mm. As in the case of Example 1, the cross section was observed by a STEM, and the XRD measurement, the XRF measurement, and the density measurement were performed.

As a result, the piezoelectric material included in the piezoelectric element of Example 4 was a perovskite single phase crystal containing calcium barium zirconate titanate as a primary component. The grain diameters R of the crystal grains in a direction perpendicular the electrode had a distribution of approximately 2 to 8 µm, and almost all the crystal grains in contact with the electrode had a grain diameter R of 2 µm or more. In the crystal grains having a grain diameter R of 2 µm or more, dislocation layers having a thickness in a range of 180 nm to the grain diameter R were present. In addition, the piezoelectric material had a preferable density value of 97% or more of the theoretical density of $(Ba_{0.85}Ca_{0.15})(Ti_{0.95}Zr_{0.05})O_3$.

Comparative Example 4

A piezoelectric element which is formed of barium titanate containing a calcium component and a zirconium component, has no dislocation layers, and is added with manganese will be described by way of example. A process including a polarization treatment and preceding steps was performed in a manner similar to that Example 4, so that a piezoelectric element having no dislocation layers was obtained. A piezoelectric material was processed to have a rectangular shape of 12 mm×3 mm×1 mm. The frequency dependences of impedance of the piezoelectric elements of Example 4 and Comparative Example 4 were measured in a manner similar to that of Example 1. As a result, it was found that the piezoelectric constant of the piezoelectric element of Example 4 was larger than that of the element of Comparative Example 4 by approximately 4%.

Example 5

A liquid discharge head shown in FIGS. 2A and 2B was formed using the same piezoelectric material as that of Example 1. The discharge of ink following an inputted electrical signal was confirmed.

Example 6

An ultrasonic motor shown in one of FIGS. 3A and 3B was formed using the same piezoelectric material as that of Example 1. Rotation behavior of the motor in accordance with the application of an alternating voltage was confirmed.

Example 7

A dust removing device shown in FIGS. 7A and 7B was formed using the same piezoelectric material as that of Example 1. When plastic beads were scattered, and an alternating voltage was applied, a good dust removing rate was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-001669, filed Jan. 7, 2011 and No. 2011-275097 filed Dec. 15, 2011, which are hereby incorporated by reference herein in their entirety.

INDUSTRIAL APPLICABILITY

According to the present invention, a piezoelectric element having an improved piezoelectric constant can be provided. Since being clean to the environment, the piezoelectric element of the present invention can be used for apparatuses, such as a liquid discharge head and an ultrasonic motor, using piezoelectric elements.

REFERENCE SIGNS LIST 101 piezoelectric element
102 independent liquid chamber
103 vibrating plate
105 discharge port
106 communicating hole
107 common liquid chamber
108 buffer layer
202 rotor
205 rotor
201, 204 vibrator
2012 piezoelectric element
2042 piezoelectric element
401, 402 electrode
403 piezoelectric material
404 crystal grain
405 aggregate
407 dislocation layer
409 crystal grain
410 piezoelectric element

The invention claimed is:

1. A piezoelectric element comprising:
a pair of electrodes; and
a piezoelectric material,
wherein the piezoelectric material includes crystal grains containing barium titanate as a primary component,
wherein crystal grains among the crystal grains which are in contact with the electrodes have a linear crystal defect, and
wherein the crystal grains having the linear crystal defect include crystal grains having a grain diameter R of 2 μm or more in a direction perpendicular to the electrodes, a region in which the linear crystal defect exist at high density relative to the other region having a thickness D in a direction perpendicular to the electrodes equal to or less than R.

2. The piezoelectric element according to claim 1, wherein the linear crystal defect is polarized in the same direction in each of the crystal grains.

3. The piezoelectric element according to claim 1, wherein Young's modulus of a surface portion of the piezoelectric material in contact with each of the electrodes is lower than Young's modulus of the whole piezoelectric material.

4. The piezoelectric element according to claim 1, wherein the piezoelectric material contains a manganese component.

5. The piezoelectric element according to claim 1, wherein the piezoelectric material has a thickness in a range of 50 μm to 10 mm.

6. A liquid discharge head using the piezoelectric element according to claim 1.

7. An ultrasonic motor using the piezoelectric element according to claim 1.

8. A dust removing device using the piezoelectric element according to claim 1.

9. The piezoelectric element according to claim 4, further comprising a bismuth component, a calcium component, and a zirconium component.

10. A device comprising the piezoelectric element according to claim 1.

* * * * *